United States Patent
Romas, Jr. et al.

(10) Patent No.: US 9,571,086 B1
(45) Date of Patent: Feb. 14, 2017

(54) BI-DIRECTIONAL SWITCH

(71) Applicant: Lockheed Martin Corporation, Bethesda, MD (US)

(72) Inventors: Gregory G. Romas, Jr., Coppell, TX (US); David L. Hoelscher, Arlington, TX (US); Jatin N. Mehta, Arlington, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 32 days.

(21) Appl. No.: 14/591,230

(22) Filed: Jan. 7, 2015

Related U.S. Application Data

(63) Continuation-in-part of application No. 14/094,977, filed on Dec. 3, 2013, now Pat. No. 9,391,055.

(60) Provisional application No. 61/733,631, filed on Dec. 5, 2012.

(51) Int. Cl.
*H03K 17/082* (2006.01)
*H03K 17/687* (2006.01)
*H03K 17/693* (2006.01)
*H03K 17/08* (2006.01)

(52) U.S. Cl.
CPC ...... *H03K 17/0822* (2013.01); *H03K 17/6872* (2013.01); *H03K 17/6874* (2013.01); *H03K 17/693* (2013.01); *H03K 2017/0806* (2013.01); *H03K 2217/0009* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,164,659 A | * | 11/1992 | Schultz | H02H 3/12 323/284 |
| 5,612,566 A | | 3/1997 | Williams | |
| 5,729,120 A | * | 3/1998 | Stich | G05F 1/613 307/64 |
| 5,910,708 A | * | 6/1999 | Nerone | H05B 41/2828 315/205 |
| 6,600,145 B1 | | 7/2003 | Herz | |
| 6,826,065 B2 | * | 11/2004 | Chekhet | H02M 5/271 363/159 |

(Continued)

OTHER PUBLICATIONS

Author Unknown, "Application Note AN-941: Paralleling Power MOSFETs," International Rectifier, retrieved Jul. 17, 2014 from http://www.irf.com/technical-info/appnotes/an-941.pdf, 12 pages.

(Continued)

*Primary Examiner* — Thomas J Hiltunen
(74) *Attorney, Agent, or Firm* — Withrow & Terranova, PLLC

(57) ABSTRACT

A bi-directional switch that includes a first terminal, a second terminal, and a plurality of ballast circuits is provided. Each ballast circuit includes a first metal-oxide-semiconductor field-effect transistor (MOSFET) comprising a first input connector, a first output connector, a first body, and a first body diode, and a second MOSFET comprising a second input connector, a second output connector, a second body, and a second body diode. Each first input connector is coupled to the first terminal, each second input connector is coupled to the second terminal, and each first output connector is coupled only to the second output connector of the second MOSFET that is in a same ballast circuit.

22 Claims, 6 Drawing Sheets

(56) References Cited

U.S. PATENT DOCUMENTS

| | | | | |
|---|---|---|---|---|
| 7,034,345 B2* | 4/2006 | Chang | ............... | H01L 25/072 257/131 |
| 7,227,259 B2 | 6/2007 | Heilbronner et al. | | |
| 7,233,112 B2* | 6/2007 | Burke | ............... | H02M 5/293 315/209 R |
| 7,745,930 B2* | 6/2010 | Connah | ............... | H01L 23/15 257/666 |
| 8,467,212 B2* | 6/2013 | Mino | ............... | H02M 1/4208 363/126 |
| 8,513,787 B2* | 8/2013 | Williams | ............... | H01L 23/49503 257/666 |
| 8,545,381 B2* | 10/2013 | Kanebako | ............... | A61M 1/1086 600/16 |
| 8,710,541 B2* | 4/2014 | Aherne | ............... | H03K 17/6872 257/121 |
| 8,884,309 B2* | 11/2014 | Miura | ............... | H01L 24/49 257/77 |
| 8,981,732 B2* | 3/2015 | Ono | ............... | H03K 17/102 320/159 |
| 9,244,724 B2* | 1/2016 | Ghai | ............... | G06F 9/467 |
| 2007/0188140 A1* | 8/2007 | Chen | ............... | H02J 7/0013 320/128 |
| 2012/0068683 A1* | 3/2012 | Liu | ............... | H02M 1/08 323/311 |
| 2013/0162023 A1* | 6/2013 | Watanabe | ............... | H03K 17/687 307/9.1 |
| 2014/0152373 A1 | 6/2014 | Romas, Jr. et al. | | |
| 2015/0042166 A1* | 2/2015 | Fujita | ............... | H02M 5/297 307/63 |
| 2015/0263100 A1* | 9/2015 | Deboy | ............... | H01L 29/2003 327/537 |

OTHER PUBLICATIONS

Forsythe, J.B., "Paralleling of Power MOSFETs for Higher Power Output," International Rectifier, retrieved Jul. 17, 2014 from http://www.irf.com/technical-info/appnotes/para.pdf, 30 pages.

Wang, W., "Power Module with Series-connected MOSFETs in Flip-chip Configuration," Graduate Thesis, Virginia Polytechnic Institute and State University, Aug. 23, 2010, 79 pages.

* cited by examiner

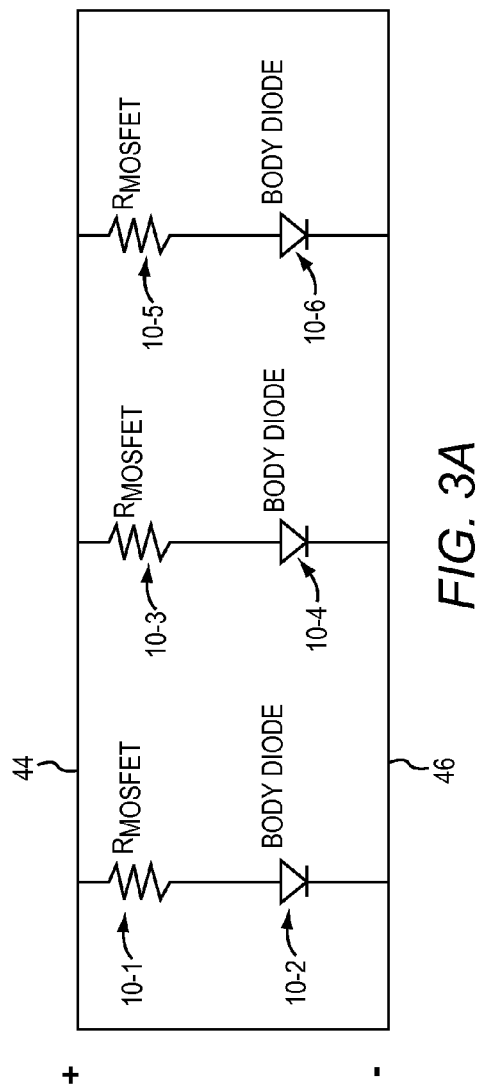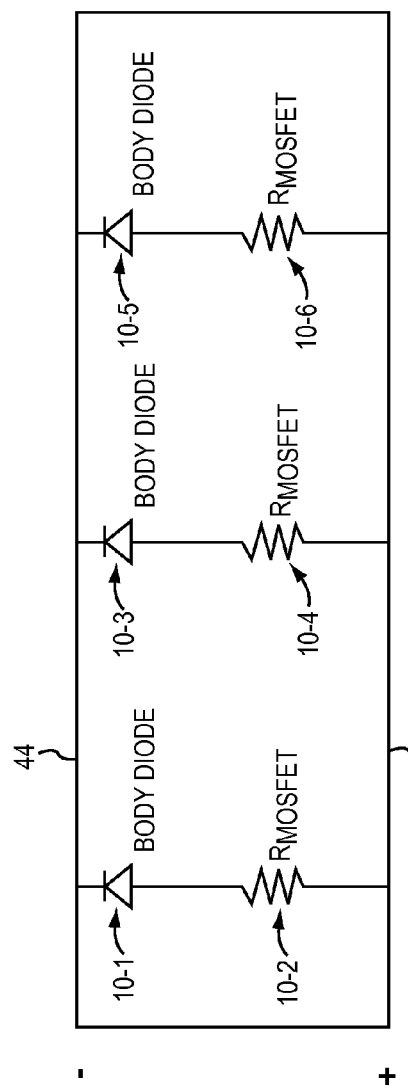

BI-DIRECTIONAL SWITCH

RELATED APPLICATIONS

This application is a continuation-in-part of co-pending U.S. patent application Ser. No. 14/094,977, filed on Dec. 3, 2013, entitled POWER MODULE HAVING STACKED SUBSTRATES ARRANGED TO PROVIDE TIGHTLY-COUPLED SOURCE AND RETURN CURRENT PATHS, which claims the benefit of U.S. Provisional Patent Application No. 61/733,631, filed on Dec. 5, 2012, entitled STACKED CERAMIC SUBSTRATES AND POWER MODULES THEREFROM, the disclosures of each of which are hereby incorporated herein by reference in their entireties.

TECHNICAL FIELD

The embodiments relate to switches, and in particular to a bi-directional switch.

BACKGROUND

Many conventional power switches are designed for direct current applications and, thus, only block electric current that is flowing in one direction. Such power switches are often simply placed back-to-back to operate in an alternating current environment. Unfortunately, this results in a relatively high inductance in the overall system as the power and return lines are uncoupled. Because current sharing is not guaranteed to be equally distributed among the multiple power switches, the power switches are de-rated to ensure that the power switches stay within design limits, requiring more power switches than may otherwise be required. This in turn increases costs and system footprint.

In order to handle a particular amount of current, power switches often implement multiple parallel current paths through the switch. Components in such paths, such as, by way of non-limiting example, metal-oxide-semiconductor field-effect transistors (MOSFETs) and diodes, conduct greater amounts of current as they rise in temperature. It is common for such components to heat at a quicker rate than other components in the same switch because of their proximity to other heat-producing electronic components. For example, components located in a center portion of a switch may heat at a quicker rate than components located on an edge portion of the switch. As a component rises in temperature, it begins to conduct greater amounts of current, which leads to an increase in temperature. This cycle ultimately can lead to a thermal runaway of the component and to a failure of the switch.

Accordingly, there is a need for bi-directional switches that have low overall inductance and that force current sharing evenly among multiple parallel current paths through the switch.

SUMMARY

The embodiments relate to a low-inductance, bi-directional switch that includes a plurality of parallel current paths that force current sharing among the parallel current paths to form a "ballasted" switch. The embodiments also include bi-directional switch cells that can be easily combined together to facilitate a scalable power switch that is sized to a particular application. While the embodiments are designed to operate in an alternating current application, the embodiments are also suitable for direct current applications.

In one embodiment a bi-directional switch is provided. The bi-directional switch includes a first terminal, a second terminal, and a plurality of ballast circuits. Each ballast circuit comprises a first metal-oxide-semiconductor field-effect transistor (MOSFET) that includes a first drain, a first source, and a first body, the first source being connected to the first body, and a second MOSFET that includes a second drain, a second source and a second body, the second source being connected to the second body. Each first drain is coupled to the first terminal, and each second drain is coupled to the second terminal. Each first source is coupled only to the second source of the second MOSFET that is in a same ballast circuit.

In one embodiment, each of the plurality of ballast circuits is configured to operate in a first ON state when a voltage at the first terminal is positive with respect to the second terminal, such that a current flows through each corresponding first drain, first source, second body, and second drain. Each of the plurality of ballast circuits is also configured to operate in a second ON state when a voltage at the first terminal is negative with respect to the second terminal, such that a current flows through each corresponding second drain, second source, first body, and first drain.

In one embodiment, the plurality of ballast circuits comprises four ballast circuits.

In one embodiment, the bi-directional switch further includes a substrate. Each of the plurality of ballast circuits is fixed with respect to the substrate, and the first drain and the second drain of each of the plurality of ballast circuits couple to the first terminal and the second terminal, respectively, at a center portion of the substrate.

In one embodiment, the first terminal comprises a first planar member that extends substantially perpendicularly with respect to the substrate a distance above the substrate, and the second terminal comprises a second planar member that has a same shape and thickness as the first planar member and extends substantially perpendicularly with respect to the substrate the distance above the substrate.

In one embodiment, each first source is coupled only to the second source of the second MOSFET that is in the same ballast circuit via a plurality of bond wires, each bond wire being an identical length.

In another embodiment, a plurality of ballast circuits coupled in parallel with one another between a first terminal and a second terminal are provided. Each of the plurality of ballast circuits comprises a first field-effect transistor (FET) having a first source, a first drain, and a first body, and a second FET having a second source, a second drain, and a second body. Each first drain is coupled to the first terminal; each second drain is coupled to the second terminal; each first source is coupled to a corresponding second source; each first source is connected to a corresponding first body; and each second source is connected to a corresponding second body.

In one embodiment, each of the plurality of ballast circuits is configured to operate in a first ON state when a voltage at the first terminal is positive with respect to the second terminal, such that a current flows through each corresponding first drain, first source, second body, and second drain. Each of the plurality of ballast circuits is also configured to operate in a second ON state when a voltage at the first terminal is negative with respect to the second terminal, such that a current flows through each corresponding second drain, second source, first body, and first drain.

In yet another embodiment, a bi-directional switch is provided that includes a first terminal, a second terminal, and a plurality of ballast circuits. Each ballast circuit comprises a first MOSFET comprising a first input connector, a first output connector, a first body, and a first body diode, and a second MOSFET comprising a second input connector, a second output connector, a second body, and a second body diode. Each first input connector is coupled to the first terminal, each second input connector is coupled to the second terminal, and each first output connector is coupled only to the second output connector of the second MOSFET that is in a same ballast circuit.

In one embodiment, each of the plurality of ballast circuits is configured to operate in a first ON state when a voltage at the first terminal is positive with respect to the second terminal, such that a current flows through each corresponding first input connector, first output connector, and second body diode. Each of the plurality of ballast circuits is also configured to operate in a second ON state when a voltage at the first terminal is negative with respect to the second terminal, such that a current flows through each corresponding second input connector, second output connector, and first body diode.

In one embodiment, in the first ON state, the first MOSFET is configured to provide a resistance to the current, and in the second ON state, the second MOSFET is configured to provide a resistance to the current.

Those skilled in the art will appreciate the scope of the disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 3A and FIG. 3B are schematic diagrams illustrating an effective electric circuit seen by an electric current at various voltages;

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The use herein of ordinals in conjunction with an element is solely for distinguishing what might otherwise be similar or identical labels, such as "first MOSFET" and "second MOSFET," and does not imply a priority, a type, an importance, or other attribute, unless otherwise stated herein. The term "about" and "substantially" used herein in conjunction with a numeric value or quantifiable characteristic means any value that is within a range of ten percent greater than or ten percent less than the numeric value or quantifiable characteristic.

The embodiments relate to a low-inductance, bi-directional switch that includes a plurality of parallel current paths, sometimes referred to herein as current channels, that force current sharing among the parallel current paths to form a "ballasted" switch. The embodiments also include bi-directional switch cells that can be easily combined together to facilitate a scalable power switch that is sized to a particular application. While the embodiments are designed to operate in an alternating current application, the embodiments are also suitable for direct current applications.

While for purposes of illustration, the embodiments will be described as utilizing N-channel enhancement mode metal-oxide-semiconductor field-effect transistors (MOSFETs), the embodiments are not so limited, and can be implemented with other types of switch elements, such as, by way of non-limiting example, insulated-gate bipolar transistors or field-effect transistors (FETs), including P-channel MOSFETS and depletion mode MOSFETs.

Figure 1A:
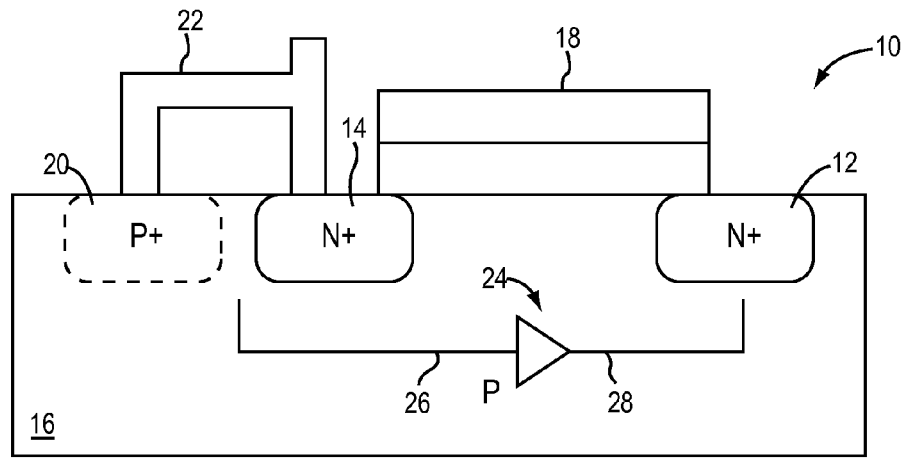
FIGS. 1A-1C are block diagrams of a conventional metal-oxide-semiconductor field-effect transistor.

FIG. 1A is a block diagram of a switch element that comprises a conventional N-channel enhancement mode MOSFET 10 in an OFF state. The MOSFET 10 includes a drain 12, a source 14, a body 16, a gate 18, and an implanted region 20. A source metallization 22 shorts the source 14 to the implanted region 20, forming a body diode 24, such that an anode 26 of the body diode 24 is coupled to the source metallization 22 and a cathode 28 of the body diode 24 is coupled to the drain 12. In conventional operation, if a voltage (V) at the drain 12 relative to the source 14 ($V_{DS}$) is positive, and a voltage at the gate 18 relative to the source 14 ($V_{GS}$) is zero or below, then no current will flow through the MOSFET 10.

Figure 1B:
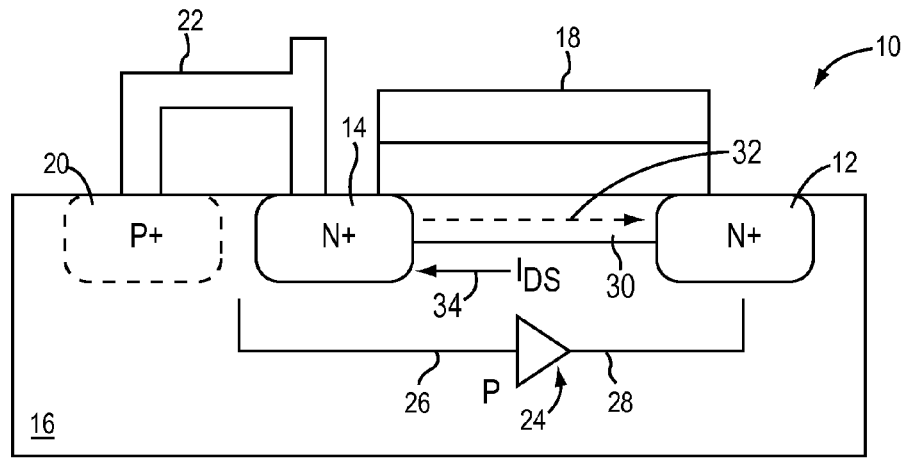

FIG. 1B is a block diagram illustrating the MOSFET 10 illustrated in FIG. 1A in an ON state. In the ON state, $V_{DS}$ is greater than zero, $V_{GS}$ is greater than zero, and a channel 30 forms under the gate 18 between the drain 12 and the source 14, facilitating an electron flow 32 from the source 14 to the drain 12, such that a current 34 ($I_{DS}$) flows from the drain 12 to the source 14.

Figure 1C:
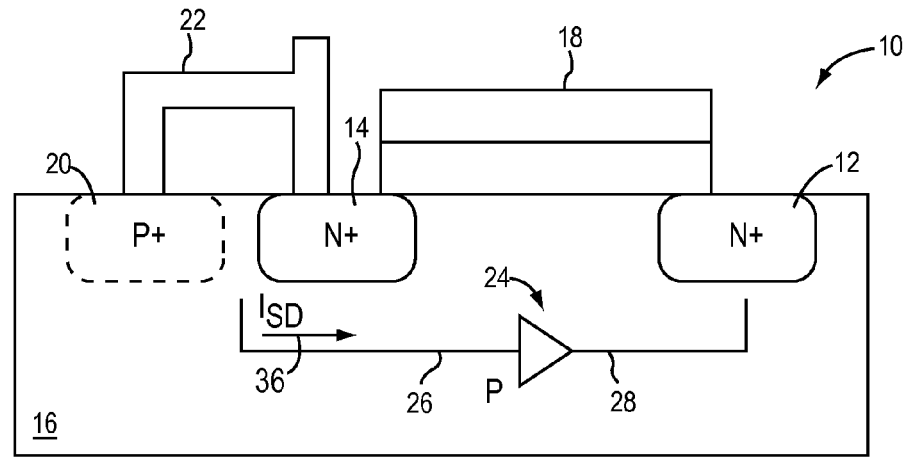

FIG. 1C is a block diagram illustrating the MOSFET 10 illustrated in FIGS. 1A and 1B in a reverse-biased state. In the reverse-biased state, the voltage at the source 14 relative to the drain 12 ($V_{SD}$) is greater than zero, and $V_{GS}$ is zero or less. Thus, no channel 30 is formed under the gate 18 between the drain 12 and the source 14. However, because $V_{SD}$ is greater than zero, a current 36 ($I_{SD}$) flows from the source metallization 22 through the body 16 and out the drain 12 via the body diode 24. It is noted that while some MOSFETs couple the implanted region 20 to the source 14 via external metallization, as illustrated herein, other MOSFETs electrically couple the body 16 to the source 14 internally.

Figure 2:
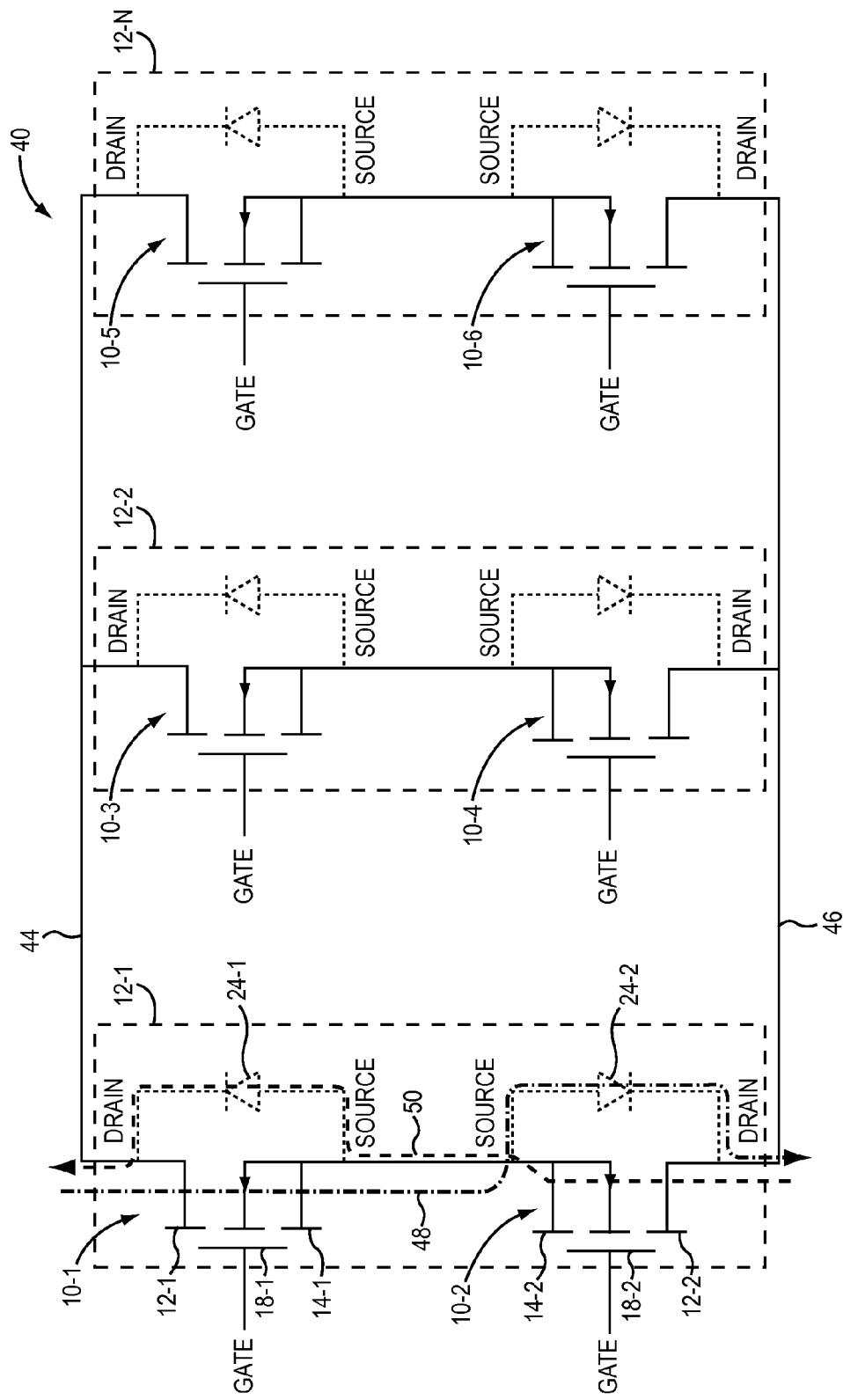
FIG. 2 is a schematic diagram of a bi-directional switch according to one embodiment.

FIG. 2 is a schematic diagram of a bi-directional switch 40 (hereinafter, switch 40) according to one embodiment. The switch 40 includes a plurality of ballast circuits 42-1, 42-2, and 42-N (generally, ballast circuits 42). The ballast circuit 42-1 includes a first MOSFET 10-1 and a second MOSFET 10-2. The first MOSFET 10-1 includes a first drain 12-1 that is coupled to a first terminal 44. The first drain 12-1 may also be referred to as an input connector, because in normal N-channel MOSFET operation current flows into the first MOSFET 10-1 through the first drain 12-1. In contrast, if the first MOSFET 10-1 were a first P-channel MOSFET, the source of the first P-channel MOSFET would be connected to the first terminal 44, and the input connector would be the source of the first P-channel MOSFET.

The first MOSFET 10-1 includes a first gate 18-1 that is used to switch the first MOSFET 10-1 on or off. A first source 14-1 is coupled to a second source 14-2 of the second MOSFET 10-2. The first source 14-1 may also be referred to as an output connector, because in normal N-channel MOSFET operation current flows out of the second MOSFET 10-2 through the first source 14-1. If the first MOSFET 10-1 and the second MOSFET 10-2 were first and second P-channel MOSFETs, the drains, rather than the sources, of the first and second P-channel MOSFETs would be connected together, and the drains would be the output connectors.

The first MOSFET 10-1 also includes a first body diode 24-1 illustrated schematically in dashed lines to indicate that the first body diode 24-1 is within the first MOSFET 10-1, and is not a separate electrical component.

The second MOSFET 10-2 includes a second gate 18-2, the second source 14-2, a second drain 12-2, and a second body diode 24-2. The second drain 12-2 is coupled to a second terminal 46. Note that the first source 14-1 of the first MOSFET 10-1 is coupled to the second source 14-2 of the second MOSFET 10-2, and not to any other source 14. The ballast circuits 42-2 and 42-N are configured identically or substantially similarly to the ballast circuit 42-1.

In operation, in a first ON state, the voltage at the first terminal 44 is high relative to the voltage at the second terminal 46, and the voltage at the first gate 18-1 of the first MOSFET 10-1 is positive with respect to the voltage at the second terminal 46. In the first ON state, current flows in accordance with the dashed arrow 48, from the first terminal 44 through the first drain 12-1 and out the first source 14-1 of the first MOSFET 10-1. The second MOSFET 10-2 is reversed biased, and thus no channel is formed under the second gate 18-2. However, the second body diode 24-2 facilitates a current flow through the body of the second MOSFET 10-2 via the second body diode 24-2.

Current flow occurs substantially the same through the ballast circuits 42-2, 42-N. The first MOSFET 10-1 has an ON resistance based on electrical characteristics of the first MOSFET 10-1 and the amount of current flowing through the first MOSFET 10-1. If a greater amount of current begins to flow through the first MOSFET 10-1 than through a first MOSFET 10-3 in the ballast circuit 42-2 or a first MOSFET 10-5 in the ballast circuit 42-N, the voltage drop across the first MOSFET 10-1 would be greater than that across the first MOSFET 10-3 and the first MOSFET 10-5. The lower voltage at the second source 14-2 reduces the current flow through the second body diode 24-2, resulting in a local-feedback loop that reduces the current through the ballast circuit 42-1 resulting in substantially equal current flow through the ballast circuits 42-1-42-N. In some embodiments, the ballast circuits 42 provide both thermal and electrical feedback, to ensure that no ballast circuit 42 runs away thermally or electrically.

In a second ON state, the voltage at the second terminal 46 is high relative to the voltage at the first terminal 44, and the voltage at the second gate 18-2 of the second MOSFET 10-2 is positive with respect to the voltage at the first terminal 44. In the second ON state, current flows in accordance with the dashed arrow 50, from the second terminal 46 through the second drain 12-2 and out the second source 14-2 of the second MOSFET 10-2. The first MOSFET 10-1 is now reversed biased, and thus no channel is formed under the first gate 18-1. However, the first body diode 24-1 facilitates a current flow through the body of the first MOSFET 10-1 via the first body diode 24-1.

Among other advantages, the embodiments facilitate a ballasted bi-directional switch utilizing pairs of MOSFETs, and eliminating the need for additional electronic components, such as ballast resistors. Such additional components increase cost, size, manufacturing complexity, and reliability and result in undesirable electrical attributes, such as increased inductance.

FIG. 3A is a schematic diagram illustrating an effective electric circuit seen by an electric current when the voltage at the terminal 44 is high relative to the voltage at the terminal 46 according to one embodiment. FIG. 3B is a schematic diagram illustrating the effective electric circuit seen by an electric current when the voltage at the terminal 46 is high relative to the voltage at the terminal 44 according to one embodiment.

Figure 4:
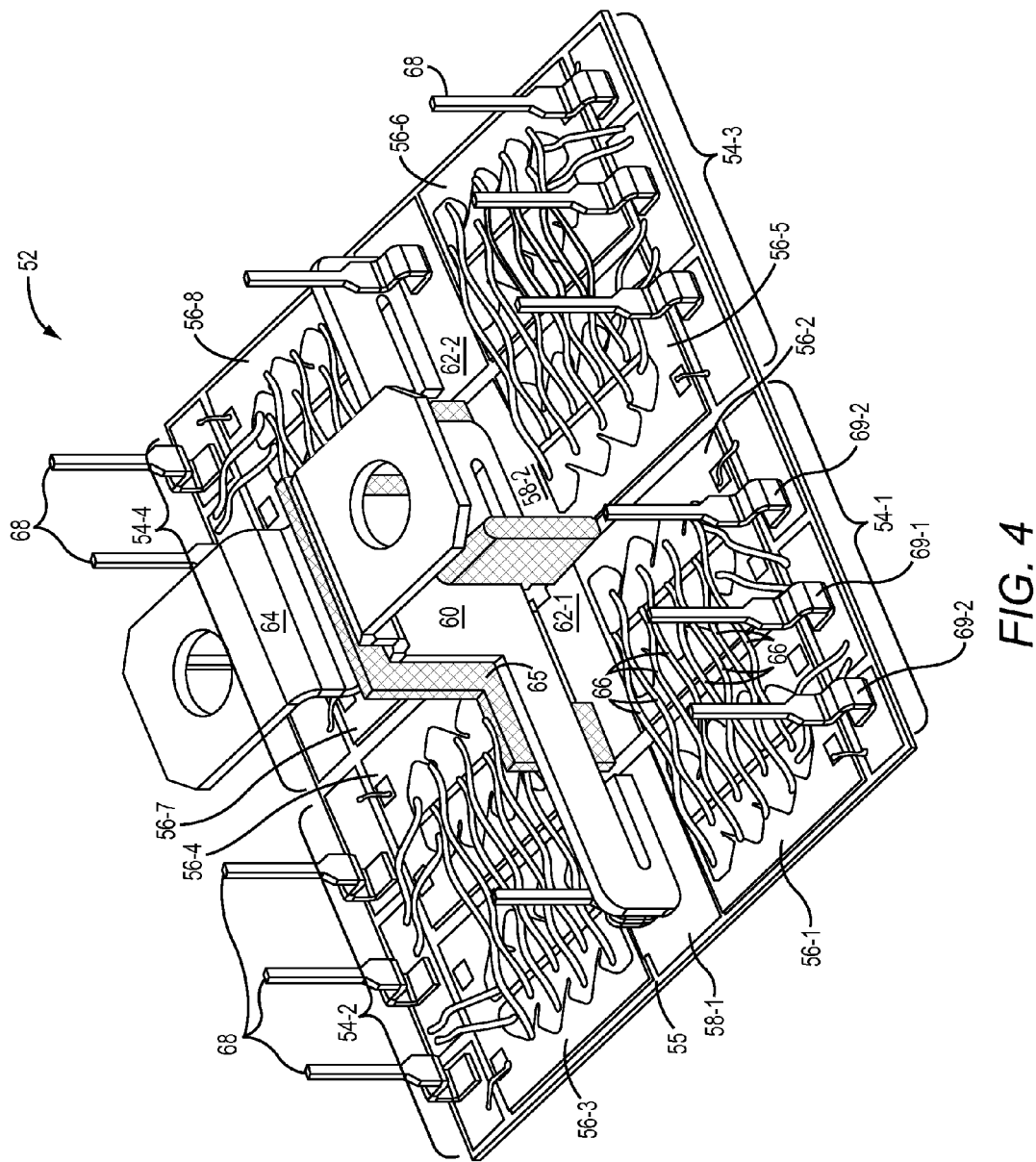
FIG. 4 is a perspective view of a bi-directional switch according to one embodiment.

FIG. 4 is a perspective view of a bi-directional switch 52 according to one embodiment. The bi-directional switch 52 includes four ballast circuits 54-1-54-4 fixed with respect to a substrate 55. The ballast circuit 54-1 includes a first MOSFET 56-1 and a second MOSFET 56-2. The ballast circuit 54-2 includes a first MOSFET 56-3 and a second MOSFET 56-4. The ballast circuit 54-3 includes a first MOSFET 56-5 and a second MOSFET 56-6. The ballast circuit 54-4 includes a first MOSFET 56-7 and a second MOSFET 56-8. While four parallel ballast circuits 54 are illustrated, the embodiments are not limited to any particular number of parallel ballast circuits 54.

A drain connector region 58-1 connects the drains of the first MOSFET 56-1 and the first MOSFET 56-3 to a first terminal 60. The drains of the MOSFETs 56 illustrated in FIG. 4 are under the MOSFETs 56, and thus cannot be seen in FIG. 4. In one embodiment, the first terminal 60 comprises a planar member that extends substantially perpendicularly with respect to the substrate 55 a distance above the substrate 55. A drain connector region 58-2 connects the drains of the first MOSFET 56-5 and the first MOSFET 56-7 to the first terminal 60.

A drain connector region 62-1 connects the drains of the second MOSFET 56-2 and the second MOSFET 56-4 to a second terminal 64. A drain connector region 62-2 connects the drains of the second MOSFET 56-6 and the second MOSFET 56-8 to the second terminal 64. In one embodiment, the second terminal 64 comprises a planar member that extends substantially perpendicularly with respect to the substrate 55 a distance above the substrate 55, and has a same shape and thickness as the first terminal 60. In one embodiment, the second terminal 64 is substantially a mirror image of the first terminal 60. The second terminal 64 extends parallel to the first terminal 60, and in close proximity to the first terminal 60. The matching sizes and close proximity of the first terminal 60 and the second terminal 64 reduce inductances in the bi-directional switch 52. A dielectric spacer material 65 is positioned between the first terminal 60 and the second terminal 64. In one embodiment, the dielectric spacer material 65 extends to a same height as the first terminal 60 and the second terminal 64. In one embodiment, the distance between the first terminal 60 and the second terminal 64 is determined by the dielectric breakdown of the dielectric spacer material 65, such that the first terminal 60 and the second terminal 64 are placed as near to one another as is possible without causing dielectric breakdown of the dielectric spacer material 65.

The source of each first MOSFET 56-1, 56-3, 56-5 and 56-7 is coupled to a corresponding source of a corresponding second MOSFET 56-2, 56-4, 56-6, and 56-8 by an electrical connection, such as, by way of non-limiting example, a plurality of bond wires 66, which, in this example, comprises eight bond wires 66. Each bond wire 66 is the same length. In one embodiment, a plurality of pins 68 extend substantially perpendicularly with respect to the substrate 55 to facilitate interconnection with one or more of the source, gate or drain of the MOSFETs 56. Each bond wire associated with a particular type of pin 68 is a same length on the bi-directional switch 52. For example, each bond wire used to connect a pin 68 to a gate is a same length, and each bond wire use to connect a pin 68 to a source, or body, respectively, is a same length.

In the example illustrated in FIG. 4, a source pin 69-1 is common to the sources of each MOSFET 56 in a respective ballast circuit 54. In some embodiments, it may be desirable to include one or more resistors between the sources of the MOSFETs 56 and the source pin 69-1 to limit current interactions with a control board (not illustrated). In some embodiments, each MOSFET 56 in a respective ballast circuit 54 may have a separate source pin 69-1 to allow for different drive configurations in drive circuitry. Gate pins 69-2 control the gates of the respective MOSFETs 56.

Figure 5:
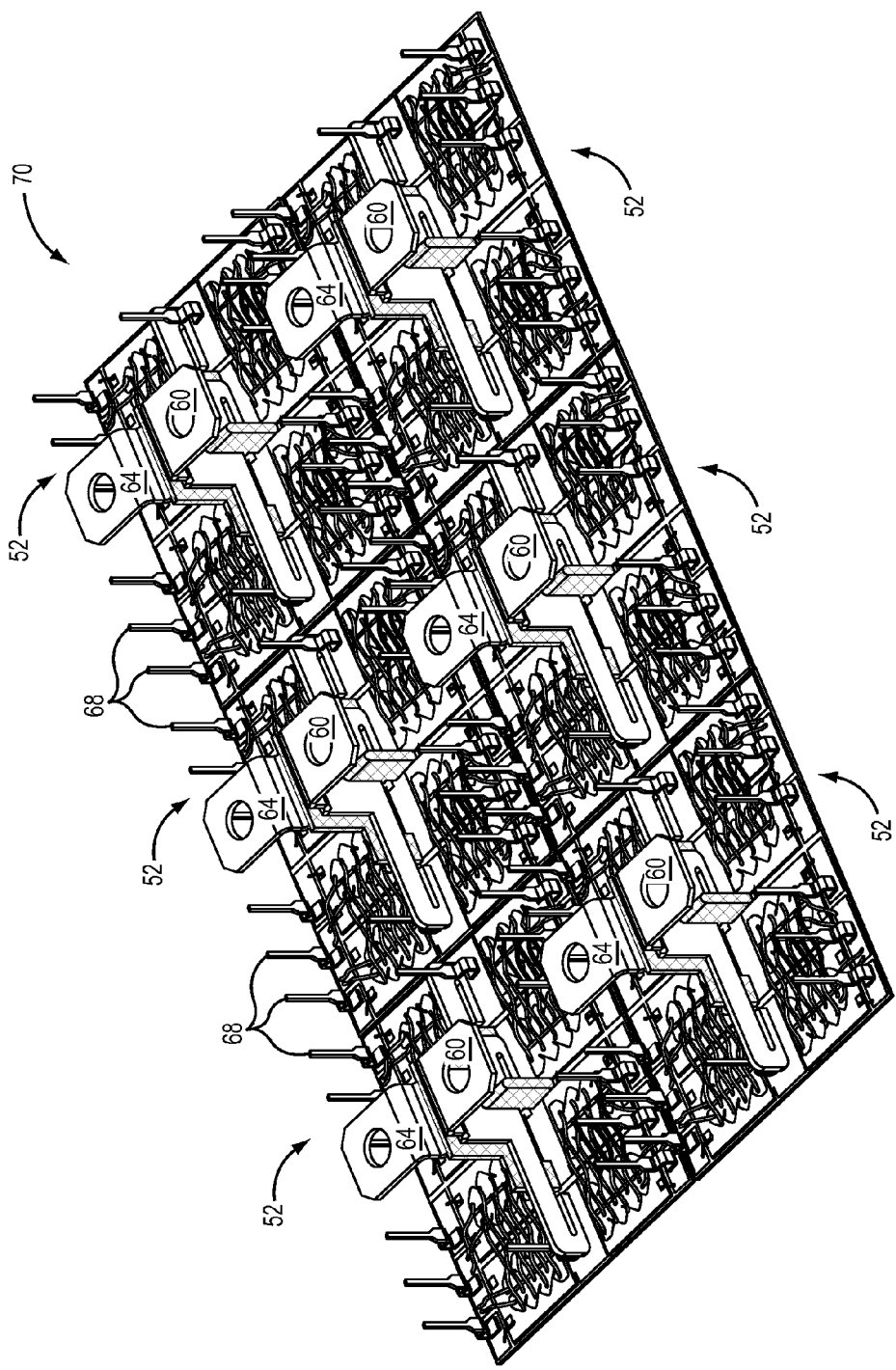
FIG. 5 is a perspective view of a bi-directional switch that utilizes a plurality of the bi-directional switches illustrated in FIG. 4.

FIG. 5 is a perspective view of a bi-directional switch 70 that utilizes a plurality of the bi-directional switches 52 illustrated in FIG. 4. FIG. 5 illustrates the scalability that is implemented by the embodiments. Any number of bi-directional switches 52 may be coupled together to handle a desired current load of a particular application. A first connection node of a power line would be coupled to each first terminal 60 of the bi-directional switches 52, and a second connection node of the power line would be coupled to each second terminal 64 of the bi-directional switches 52. The gates and the sources of the MOSFETs are accessible via the pins 68.

Figure 6:
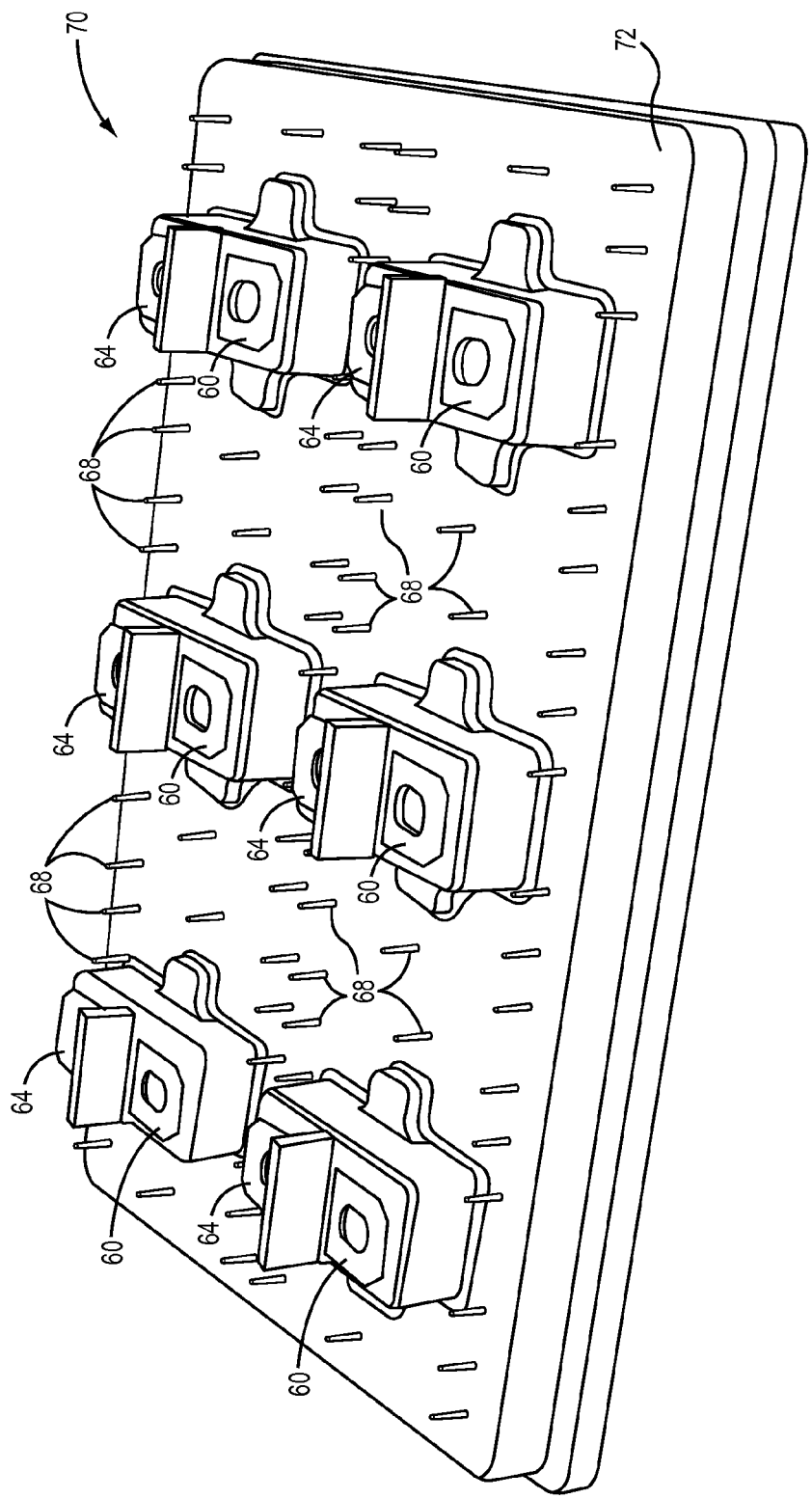
FIG. 6 is a perspective view of the bi-directional switch illustrated in FIG. 5 enclosed by a cover.

FIG. 6 is a perspective view of the bi-directional switch 70 illustrated in FIG. 5 enclosed by a cover 72.

Among other advantages, the embodiments eliminate issues that occur due to parametric mismatches between the switch elements, such as the MOSFETs 56, and ensure equal current distribution over each current channel, thereby equalizing the thermal distribution over each current channel to prevent any one switch element in a current channel from thermally running away, and ultimately breaking down. For example, due simply to manufacturing processes, doping variations, and the like, each switching element may have a slightly different current parametric characteristic that results in a slightly different voltage drop across the switch element. Thus, each current channel also has a slightly different (i.e., non-uniform) current parametric characteristic defined by the combination of current parametric characteristics of the switch elements in the respective current channel. The arrangement described above eliminates the effect of such current parametric characteristic mismatches by introducing a local current feedback mechanism in each current channel that ensures a substantially equal distribution of current over each current channel irrespective of the current parametric characteristics of each current channel. Such arrangement also facilitates the use of switch elements that may be less expensive to manufacture, since such switch elements need not be precisely matched to one another.

Moreover, each current channel has an associated heating curve that identifies a thermal condition of the current channel in response to current flowing through the current channel. The local current feedback forces a substantially equal thermal distribution over the plurality of current channels, ensuring that no single current channel thermally runs away.

Those skilled in the art will recognize improvements and modifications to the preferred embodiments of the disclosure. All such improvements and modifications are considered within the scope of the concepts disclosed herein and the claims that follow.

What is claimed is:

1. A bi-directional switch, comprising:
   a first terminal and a second terminal;
   a plurality of ballast circuits, each ballast circuit comprising:
      a first metal-oxide-semiconductor field-effect transistor (MOSFET) comprising a first drain, a first source, and a first body, the first source being connected to the first body; and
      a second MOSFET comprising a second drain, a second source and a second body, the second source being connected to the second body; and
   wherein each first drain is directly coupled to the first terminal, each second drain is directly coupled to the second terminal, and each first source is coupled only to the second source of the second MOSFET that is in a same ballast circuit.

2. The bi-directional switch of claim 1, wherein:
   each of the plurality of ballast circuits is configured to operate in a first ON state when a voltage at the first terminal is positive with respect to the second terminal, such that a current flows through each corresponding first drain, first source, second body, and second drain; and
   each of the plurality of ballast circuits is configured to operate in a second ON state when a voltage at the first terminal is negative with respect to the second terminal, such that a current flows through each corresponding second drain, second source, first body, and first drain.

3. The bi-directional switch of claim 1, wherein the plurality of ballast circuits comprises four ballast circuits.

4. The bi-directional switch of claim 1, further comprising a substrate, wherein:
   each of the plurality of ballast circuits is fixed with respect to the substrate, and the first drain and the second drain of each of the plurality of ballast circuits couple to the first terminal and the second terminal, respectively, at a center portion of the substrate.

5. The bi-directional switch of claim 4, wherein the first terminal comprises a first planar member that extends substantially perpendicularly with respect to the substrate a distance above the substrate, and the second terminal comprises a second planar member that has a same shape and thickness as the first planar member and extends substantially perpendicularly with respect to the substrate the distance above the substrate.

6. The bi-directional switch of claim 5, wherein the first planar member and the second planar member extend parallel with respect to one another and further comprising a dielectric spacer material positioned between the first planar member and the second planar member.

7. The bi-directional switch of claim 1, wherein each first source is coupled only to the second source of the second MOSFET that is in the same ballast circuit via a plurality of bond wires, each bond wire being an identical length.

8. The bi-directional switch of claim 7, wherein each first source is coupled only to the second source of the second MOSFET that is in the same ballast circuit via a same number N of bond wires.

9. The bi-directional switch of claim 1, wherein each first MOSFET comprises a first gate that is coupled to a corresponding first gate terminal via a respective first gate bond wire, and each second MOSFET comprises a second gate that is coupled to a corresponding second gate terminal via a respective second gate bond wire, wherein each first gate bond wire and each second gate bond wire is a same length.

10. The bi-directional switch of claim 1, wherein each ballast circuit operates to provide electrical feedback in response to a current flowing through the respective ballast circuit to cause substantially a same current flow through each ballast circuit of the plurality of ballast circuits.

11. A plurality of ballast circuits coupled in parallel with one another between a first terminal and a second terminal, wherein each of the plurality of ballast circuits comprises:
   a first field-effect transistor (FET) having a first source, a first drain, and a first body; and
   a second FET having a second source, a second drain, and a second body, and
   wherein:
      each first drain is directly coupled to the first terminal;
      each second drain is directly coupled to the second terminal;
      each first source is coupled only to a corresponding second source of the second FET in a same ballast circuit as the first source;
      each first source is connected to a corresponding first body; and
      each second source is connected to a corresponding second body.

12. The plurality of ballast circuits of claim 11, wherein:
   each of the plurality of ballast circuits is configured to operate in a first ON state when a voltage at the first terminal is positive with respect to the second terminal, such that a current flows through each corresponding first drain, first source, second body, and second drain; and
   each of the plurality of ballast circuits is configured to operate in a second ON state when a voltage at the first terminal is negative with respect to the second terminal, such that a current flows through each corresponding second drain, second source, first body, and first drain.

13. The plurality of ballast circuits of claim 11, further comprising a substrate, wherein:
   each of the plurality of ballast circuits is fixed with respect to the substrate, the first drain and the second drain of each of the plurality of ballast circuits couple to the first terminal and the second terminal, respectively, at a center portion of the substrate.

14. The plurality of ballast circuits of claim 11, wherein each first source is coupled to the corresponding second source via a plurality of bond wires, each bond wire being an identical length.

15. The plurality of ballast circuits of claim 11, wherein the first FET comprises a first metal-oxide-semiconductor field-effect transistor (MOSFET), and the second FET comprises a second MOSFET.

16. A bi-directional switch, comprising:
   a first terminal and a second terminal;
   a plurality of ballast circuits, each ballast circuit comprising:
      a first switching element comprising a first drain, a first source, a first body, and a first body diode; and
      a second switching element comprising a second drain, a second source, a second body, and a second body diode; and
   wherein each first drain is directly coupled to the first terminal, each second drain is directly coupled to the second terminal, and each first source is coupled only to the second source of the second switching element that is in a same ballast circuit.

17. The bi-directional switch of claim 16, wherein:
   each of the plurality of ballast circuits is configured to operate in a first ON state when a voltage at the first terminal is positive with respect to the second terminal, such that a current flows through each corresponding first drain, first source, and second body diode; and
   each of the plurality of ballast circuits is configured to operate in a second ON state when a voltage at the first terminal is negative with respect to the second terminal, such that a current flows through each corresponding second drain, second source, and first body diode.

18. The bi-directional switch of claim 17, wherein in the first ON state, the first switching element is configured to provide a resistance to the current, and in the second ON state, the second switching element is configured to provide a resistance to the current.

19. The bi-directional switch of claim 16, further comprising a substrate, wherein:
   each of the plurality of ballast circuits is fixed with respect to the substrate, and the first drain and the second drain of each of the plurality of ballast circuits couple to the first terminal and the second terminal, respectively, at a center portion of the substrate.

20. The bi-directional switch of claim 16, wherein the first switching element comprises a first metal-oxide-semiconductor field-effect transistor (MOSFET) and the second switching element comprises a second MOSFET.

21. A bi-directional power switch module, comprising:
   a first terminal and a second terminal; and
   a plurality of current channels directly coupled between the first terminal and the second terminal, each current channel having a respective current parametric characteristic that is non-uniform with respective current parametric characteristics of each other current channel, and each current channel configured to introduce a respective local current feedback to force substantially equal current distribution over the plurality of current channels, wherein each current channel comprises:
      a first metal-oxide-semiconductor field-effect transistor (MOSFET) comprising a first drain, a first source, and a first body, the first source being connected to the first body; and
      a second MOSFET comprising a second drain, a second source, and a second body, the second source being connected to the second body; and
   wherein each first drain is directly coupled to the first terminal, each second drain is directly coupled to the second terminal, and each first source is coupled only to the second source of the second MOSFET that is in a same current channel.

22. The bi-directional power switch module of claim 21, wherein each current channel has an associated heating curve that differs from a respective heating curve associated with each other current channel, and wherein the respective local current feedback forces a substantially equal thermal distribution over the plurality of current channels.

* * * * *